United States Patent
Tahara et al.

(10) Patent No.: US 10,869,400 B2
(45) Date of Patent: Dec. 15, 2020

(54) CASE

(71) Applicants: AutoNetworks Technologies, Ltd., Yokkaichi, Mie (JP); Sumitomo Wiring Systems, Ltd., Yokkaichi, Mie (JP); SUMITOMO ELECTRIC INDUSTRIES, LTD., Osaka-shi, Osaka (JP)

(72) Inventors: Hideaki Tahara, Mie (JP); Kazuyoshi Ohara, Mie (JP); Munsoku O, Mie (JP); Arinobu Nakamura, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka-Shi, Osaka (JP)

( * ) Notice: Subject to any disclaimer, the term of this patent is extended or adjusted under 35 U.S.C. 154(b) by 558 days.

(21) Appl. No.: 15/547,081

(22) PCT Filed: Jan. 28, 2016

(86) PCT No.: PCT/JP2016/052410
§ 371 (c)(1),
(2) Date: Jul. 28, 2017

(87) PCT Pub. No.: WO2016/132840
PCT Pub. Date: Aug. 25, 2016

(65) Prior Publication Data
US 2018/0027675 A1    Jan. 25, 2018

(30) Foreign Application Priority Data
Feb. 18, 2015    (JP) .................................. 2015-029623

(51) Int. Cl.
*H05K 5/00*    (2006.01)
*H05K 5/02*    (2006.01)

(52) U.S. Cl.
CPC ......... *H05K 5/0217* (2013.01); *H05K 5/0026* (2013.01); *H05K 5/0056* (2013.01); *H05K 5/0213* (2013.01); *H05K 5/0247* (2013.01)

(58) Field of Classification Search
CPC ..... H05K 5/0056; H05K 5/0213; H05K 5/063
(Continued)

(56) References Cited

U.S. PATENT DOCUMENTS

2008/0236793 A1    10/2008    Ma et al.
2012/0091154 A1*    4/2012    Satoh .................. B60R 16/0238
                                        220/660
2019/0078597 A1*    3/2019    Sone ........................ H02G 3/30

FOREIGN PATENT DOCUMENTS

JP    2002-134939 A    5/2002
JP    2008-258577 A    10/2008
(Continued)

OTHER PUBLICATIONS

Search Report for PCT/JP2016/052410, dated Apr. 19, 2016.

*Primary Examiner* — Don M Anderson
(74) *Attorney, Agent, or Firm* — Honigman LLP

(57) ABSTRACT

A case is provided with a drainage channel that smoothly drains water while also being able to suppress the intrusion of water into a housing space. The case includes a first case body in which a channel extending from a region serving as the housing space is formed. The channel includes a first channel portion having one end side connected to a first outlet and another end side connected to a second outlet, and a second channel portion connects the first channel portion and the housing space. Out of the opening edges of the second channel portion that face the first channel portion, a second-side opening edge, which is the edge on the second outlet side of the first channel portion, is located nearer to the (Continued)

housing space than a first-side opening edge, which is the edge on the first outlet side of the first channel portion, is.

8 Claims, 11 Drawing Sheets

(58) Field of Classification Search
USPC .......................................................... 220/3.8
See application file for complete search history.

(56) References Cited

FOREIGN PATENT DOCUMENTS

| | | | |
|---|---|---|---|
| JP | 2011-223658 A | | 11/2011 |
| WO | WO2013129132 | * | 1/2006 |

* cited by examiner

CASE

CROSS-REFERENCE TO RELATED APPLICATIONS

This application is the U.S. national stage of PCT/JP2016/052410 filed Jan. 28, 2016, which claims priority of Japanese Patent Application No. JP 2015-029623 filed Feb. 18, 2015.

TECHNICAL FIELD

The present invention relates to a case provided with a drainage channel.

BACKGROUND

As disclosed in JP 2002-134939A noted below and the like, cases disposed in an environment that has large variations in temperature, such as a vehicle-mounted case for housing an electrical device, are sometimes provided with a channel for the drainage of water produced by the condensation of water vapor.

Such cases need to have a structure in which water cannot easily intrude into the housing space that houses a housed object, while also ensuring the function of smoothly draining water through a channel.

A problem to be solved by the present invention is providing a case with a drainage channel that smoothly drains water and can suppress the intrusion of water into the housing space.

SUMMARY

A case according to the present invention for solving the aforementioned problem is a case including: a first case body in which a channel that extends from a region serving as the housing space is formed, wherein the channel includes a first channel portion having one end side connected to a first outlet and another end side connected to a second outlet, and a second channel portion that connects the first channel portion and the housing space, and out of opening edges of the second channel portion that face the first channel portion, a second-side opening edge that is an edge on a second outlet side of the first channel portion is located nearer to the housing space than a first-side opening edge that is an edge on a first outlet side of the first channel portion is.

The case may include a second case body that is integrated with the first case body, a portion that serves as the second outlet being formed in the second case body, and a boundary between an outer wall surface of the first case body and an outer wall surface of the second case body may be located at a lower position than the second outlet is.

The first channel portion may include a portion that is bent toward the second channel portion between the first outlet and a portion connected to the second channel portion.

The size of an opening of the second channel portion that faces the first channel portion is smaller than the size of an opening of the second channel portion that faces the housing space.

The second channel portion may be bent.

Advantageous Effects of Invention

In the case according to the present invention, out of the opening edges of the second channel portion that face the first channel portion, the second-side opening edge, which is the edge on the second outlet side of the first channel portion, is located nearer to the housing space than the first-side opening edge, which is the edge on the first outlet side of the first channel portion, is, and therefore water that intrudes from the first outlet is not likely to intrude into the second channel portion. In other words, water that intrudes from the first outlet is likely to be directly drained from the second outlet. Accordingly, water is smoothly drained, and the intrusion of water into the housing space is suppressed.

If the boundary between the outer wall surface of the first case body and the outer wall surface of the second case body, in which the portion serving as the second outlet is formed, is located at a lower position than the second outlet is, the intrusion of water from the second outlet is suppressed. In other words, water that intrudes from the first outlet into the first channel portion is likely to be drained from the second outlet, and water is not likely to intrude from the second outlet into the first channel portion, thus suppressing the intrusion of water into the housing space.

With a configuration in which the first channel portion includes the portion that is bent toward the second channel portion between the first outlet and the portion connected to the second channel portion, the flow of water intruding from the first outlet is moved away from the second channel portion (boundary between the first channel portion and the second channel portion) by the bent portion. In other words, water that intrudes from the first outlet into the first channel portion is even less likely to intrude into the second channel portion.

According to the second channel portion in which the size of the opening that faces the first channel portion is smaller than the size of the opening that faces the housing space, water inside the housing space is likely to intrude into the second channel portion, and water in the first channel portion is not likely to intrude into the second channel portion.

If the second channel portion is bent, even if water intrudes from the first channel portion into the second channel portion, the water is not likely to reach the housing space.

DETAILED DESCRIPTION OF PREFERRED EMBODIMENTS

Hereinafter, an embodiment of the present invention will be described in detail with reference to the drawings. Note that unless particularly specified otherwise, the height direction (up-down direction) in the following description refers to the direction along the Z axis shown in FIG. 1 and the like (the side in the direction of the arrow being upward), the width direction refers to the direction along an X axis, the front-back direction refers to the direction along a Y axis (the side in the direction of the arrow being rearward), and the surface direction refers to the direction along the XY plane. Note that these directions do not limit the installation direction of a case 1, and the case 1 according to the present embodiment is generally disposed such that a first case body is located on the lower side, and a second case body 20 is located on the upper side.

Figure 1:
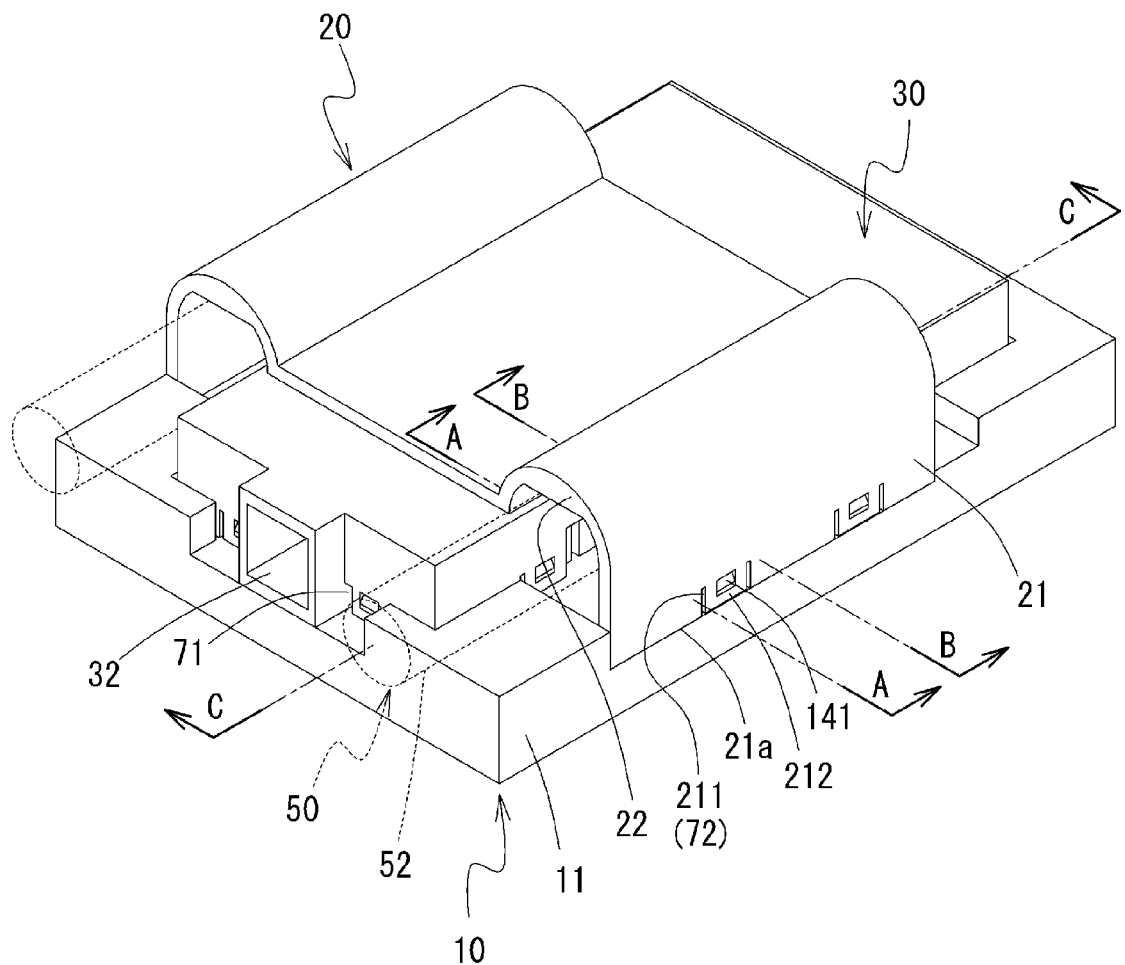
FIG. 1 is a diagram schematically showing the exterior of a case according to an embodiment of the present invention.
Figure 1:
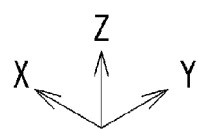
Figure 2:
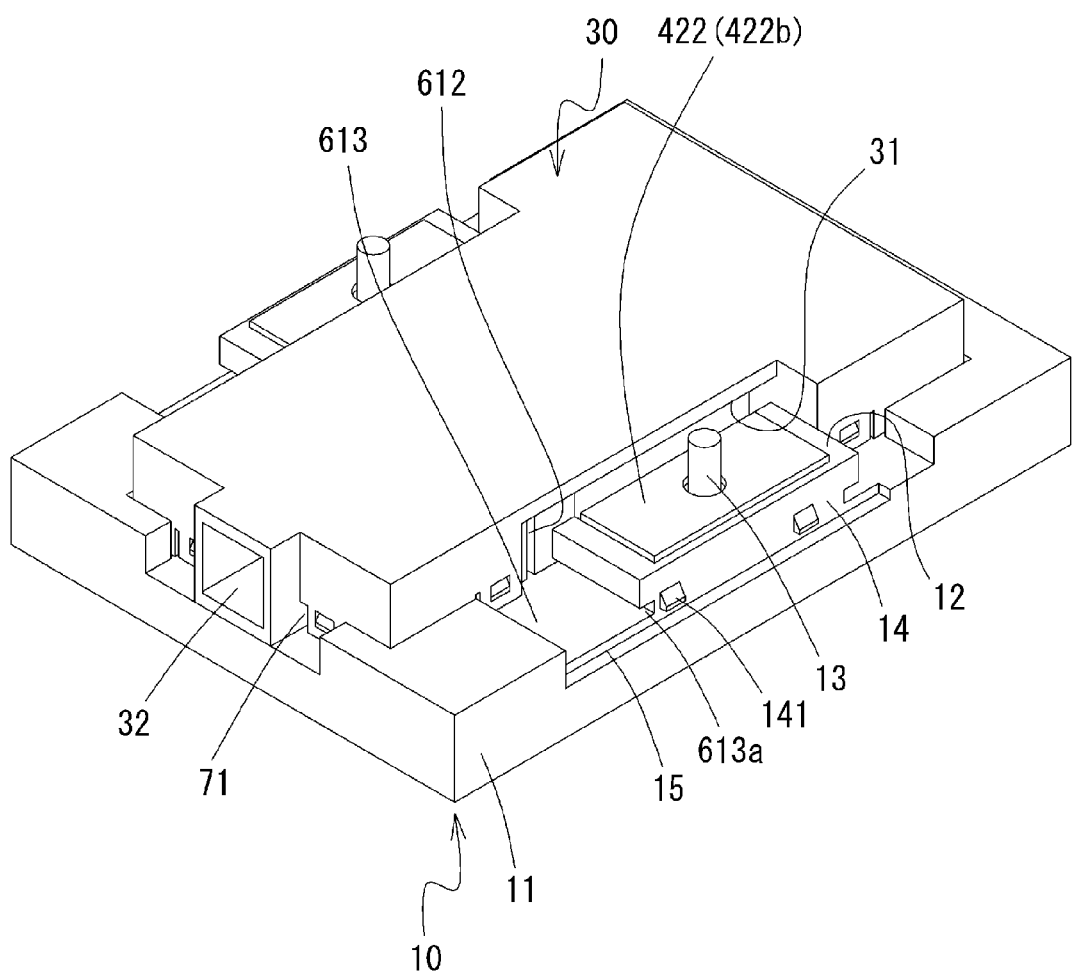
FIG. 2 is a diagram schematically showing the exterior of the case according to the present invention in a state where a second case body has been removed.
Figure 2:
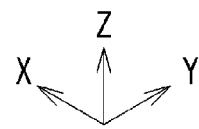

As shown in FIGS. 1 and 2, the case 1 according to an embodiment of the present invention is a case for housing a vehicle-mounted electrical device, and includes a first case body 10, a second case body 20, and a third case body 30. The object (electrical device) that is to be housed in the case 1 of the present embodiment is a substrate unit 40. A first space S1 (corresponding to a housing space of the present invention) for housing the housed object is formed in the first case body 10. The top of the first space S1 formed in the first case body 10 is covered by the third case body 30 (see FIGS. 3, 4, and the like). In other words, the first space S1 can also be said to be a space formed by the first case body 10 and the third case body 30. The first space S1 of the present embodiment is a space that is flat in the surface direction.

Also, connection members 50 (electrical wires 52 with terminals 51 in the present embodiment), which are for connection to the substrate unit 40 that is the housed object, are housed in the second case body 20. The bottoms of second spaces S2 formed in the second case body 20 are covered by the first case body 10. In other words, the second spaces S2 can also be said to be spaces formed by the first case body 10 and the second case body 20. The second spaces S2 are spaces in which openings for passage of the connection members 50 are formed.

In the present embodiment, the substrate unit 40 that is the housed object is housed in the first space S1. Note that although the substrate unit 40 and the connection members 50, which are for electrically connecting the substrate unit 40 to an external device, are illustrated using solid lines in the figures (excluding FIG. 1), the substrate unit 40 and the connection members 50 are not constituent elements of the case 1 according to the present embodiment. In other words, the substrate unit 40 is merely one example of an object to be housed in the case 1 according to the present embodiment. The substrate unit 40 has the following configuration.

Figure 9:
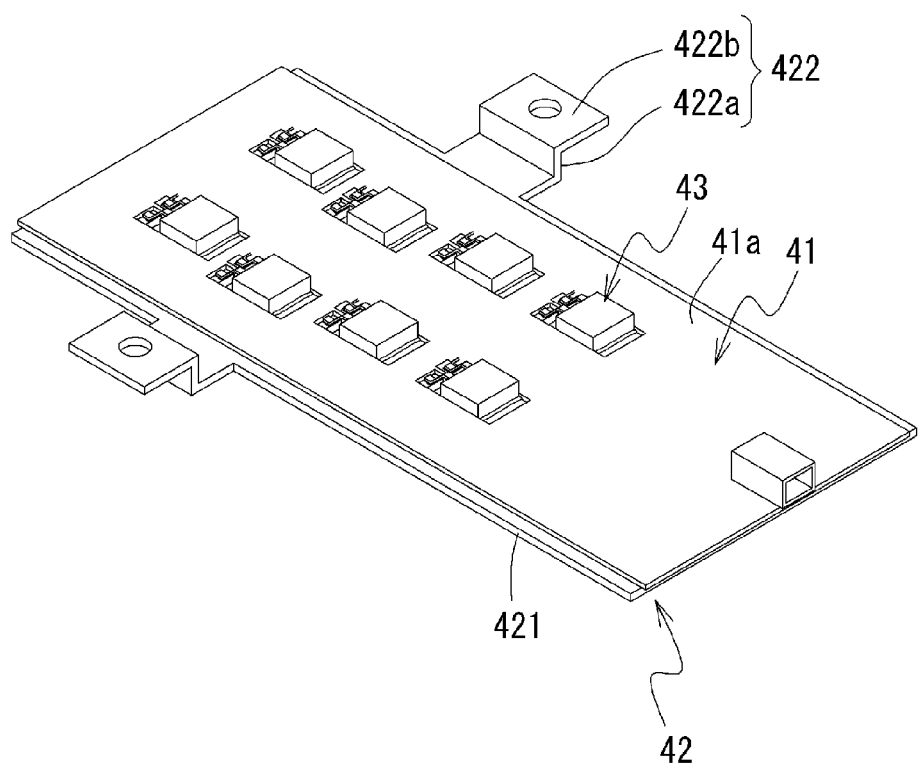
FIG. 9 is an exterior view of a substrate unit that is one example of an object housed in the case body according to the embodiment of the present invention.
Figure 10:
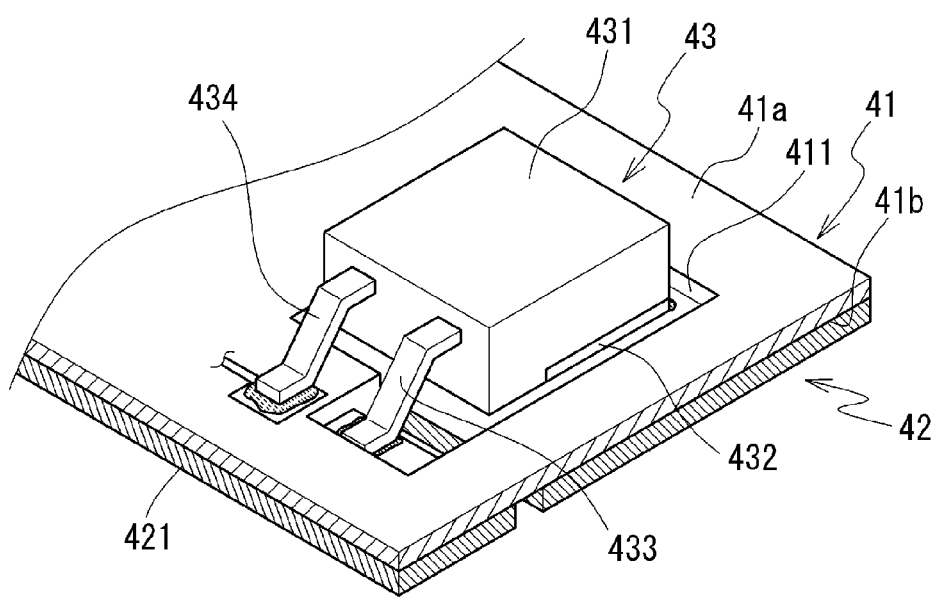
FIG. 10 is a diagram showing an enlarged view of a portion on which an electronic component of the substrate unit (one of the terminals being for electrical connection to a conductive member) is mounted (showing the substrate and the conductive member fixed thereto).
Figure 11:
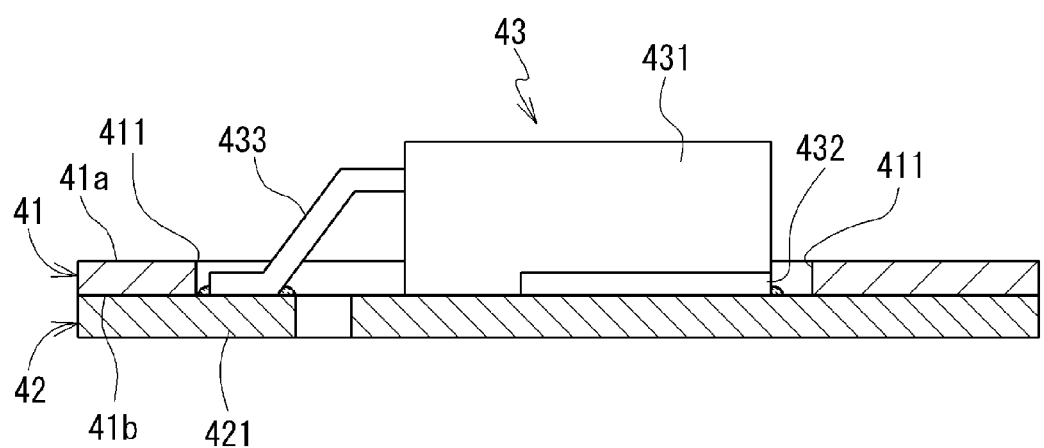
FIG. 11 is a cross-sectional view of the portion on which the electronic component of the substrate unit (one of the terminals being for electrical connection to the conductive member) is mounted (showing the substrate and the conductive member fixed thereto), and is taken along a plane that passes through a drain terminal and a source terminal.

The substrate unit 40 shown in FIGS. 9 to 11 includes a substrate 41 and a conductive member 42. The substrate 41 is obtained by forming a conductive pattern on one surface 41a (upper surface). The conduction path constituted by the conductive pattern is a conduction path for control (circuit part), and the current that flows through it is relatively smaller than the current that flows through the conduction path (circuit part) constituted by the conductive member 42.

The conductive member 42 has a main body portion 421 that is fixed to another surface 41b (lower surface) of the substrate 41, and extension portions 422 that extend from the main body portion 421. The conductive member 42 is formed with a predetermined shape by press processing or the like. The main body portion 421 of the conductive member 42 constitutes a power conduction path, which is a portion through which a relatively large current (larger than that which flows through the conduction path constituted by the conductive pattern) flows. Note that although the specific configurations of the conduction paths are not described here or illustrated, the main body portion 421 of the conductive member 42 has multiple portions that constitute the conduction path. These portions are each separated so as to not short circuit, and are integrated by being fixed to the substrate 41. These portions are connected by extra length portions before being fixed to the substrate 41, and are each separated from each other (prevented from being in direct contact) by cutting off the extra length portions after being fixed to the substrate 41. The conductive member 42 (main body portion 421) is also called a bus bar (bus bar plate) or the like. The main body portion 421 of the conductive member 42 is fixed to the other surface 41b of the substrate 41 via an insulating adhesive or bonding sheet, for example. The substrate 41 and the conductive member 42 are thus integrated.

The extension portions 422 of the conductive member 42 are portions formed so as to rise up from the main body portion 421. The extension portions 422 of the present embodiment each have a portion that extends upward from the main body portion 421 (base end portion 422a) and a portion that is bent from the leading end (upper end) of the base end portion 422a and extends along the surface direction (leading end portion 422b). The conductive member 42 of the present embodiment has multiple extension portions 422. The extension portions 422 are each integrated with any one of the separate main body portions 421 described above. In the present embodiment, one separated portion is connected to one extension portion 422. The leading end portions 422b of the extension portions 422 are portions for connection to the connection members 50 (input terminal portions or output terminal portions). The substrate unit 40 (conductive member 42) and an external device are electrically connected via these connection members 50.

Electronic components 43 each have an element main body 431 and terminal portions. Multiple electronic components 43 are mounted on the substrate unit 40. At least one terminal of a specific electronic component 43 is electrically connected to the main body portion 421 of the conductive member 42 via an opening 411 formed in the substrate 41. A transistor (FET) can be given as one example for the terminals among which at least one terminal is electrically connected to the main body portion 421 of the conductive member 42. A drain terminal 432 and a source terminal 433 of the transistor are connected to the main body portion 421 of the conductive member 42, and a gate terminal 434 is connected to the conductive pattern of the substrate 41. In this way, at least one terminal of at least one of the electronic components 43 is directly electrically connected to the conductive member 42. From another viewpoint, this means that there may be an electronic component 43 in which all of the terminals are directly electrically connected to the conductive pattern formed on the substrate 41 (in which at least one terminal is not directly electrically connected to the conductive member 42).

Figure 3:
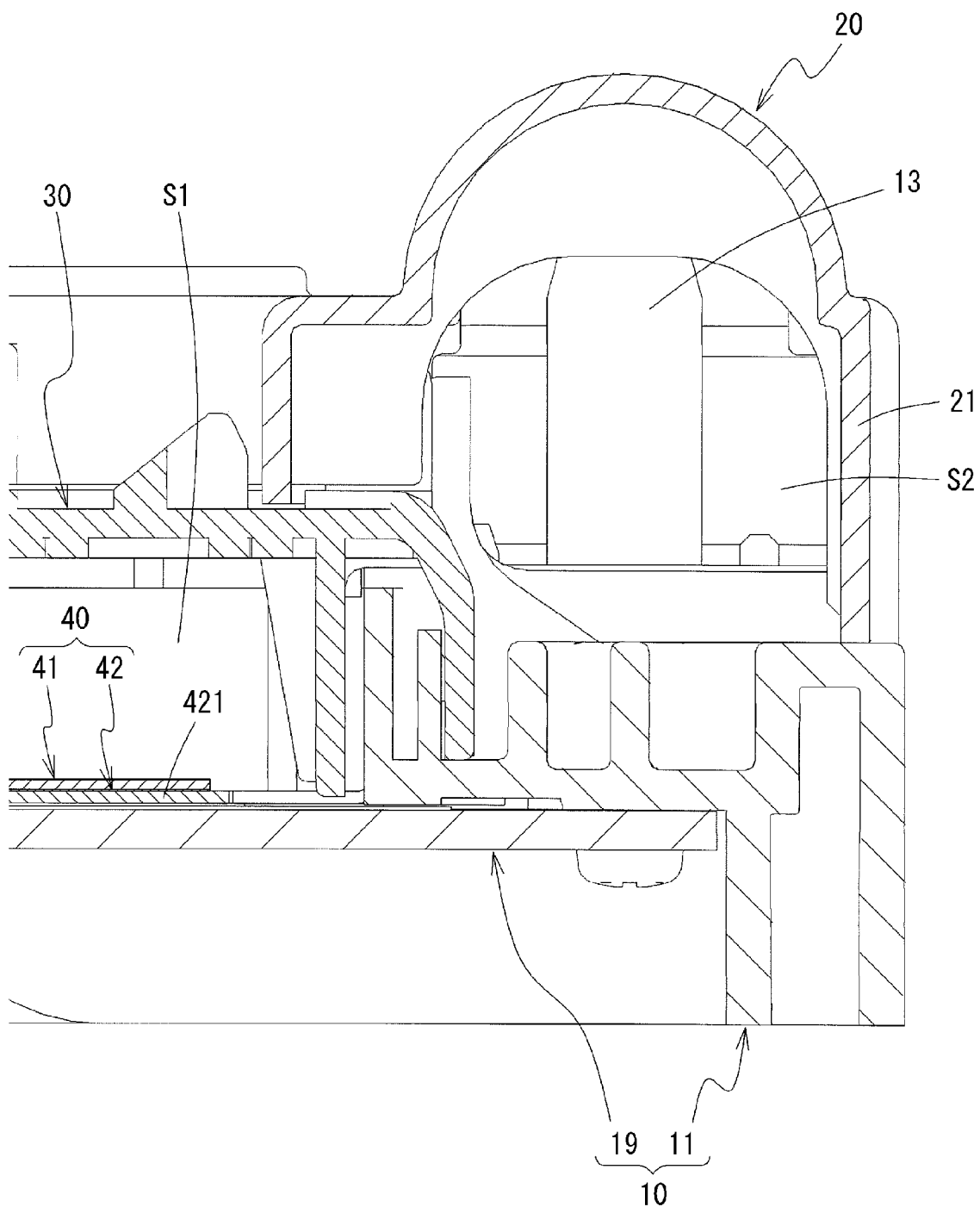
FIG. 3 is a cross-sectional view taken along line A-A in FIG. 1 (connection member not shown).
Figure 4:
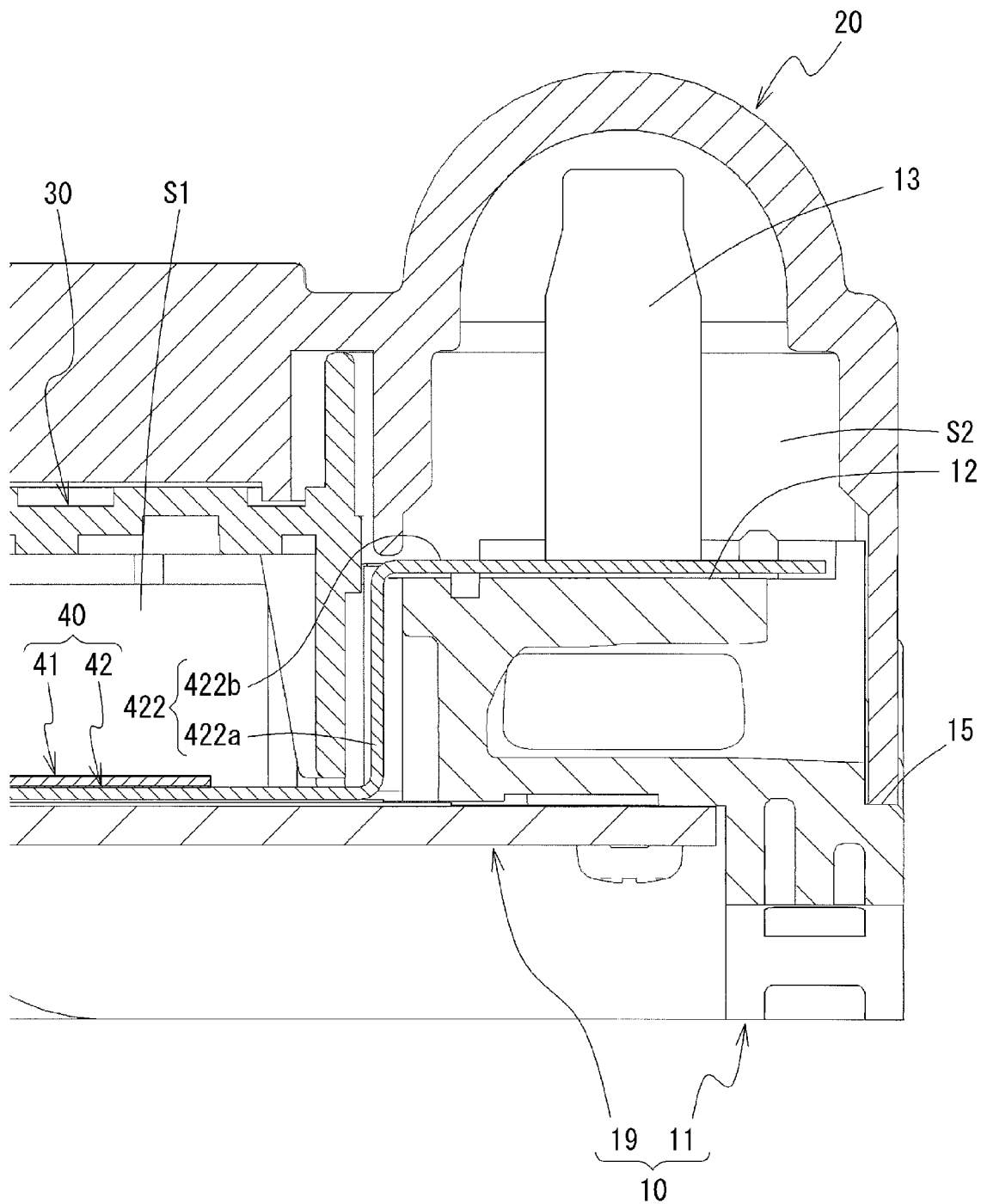
FIG. 4 is a cross-sectional view taken along line B-B in FIG. 1 (connection member not shown).

The substrate unit 40 configured in this way is housed in the first space S1 (see FIGS. 3, 4, and the like). Specifically, the portion of the substrate unit 40 other than the extension portions 422 is housed in the first space S1. In the present embodiment, the first case body 10 that forms the first space S1 includes a frame member 11 and a heat dissipation member 19. The frame member 11 has an approximately quadrangular shape, and the inward region serves as the first space S1. The heat dissipation member 19 is a flat plate-shaped member formed from a material that has high heat conductivity (copper or the like), and is fixed to the lower side of the frame member 11. The heat dissipation member 19 is fixed so as to cover the lower opening of the frame member 11. The flat first space S1 that expands in the surface direction is formed by the frame member 11 and the heat dissipation member 19. The frame member 11 can also be said to be the member that constitutes the side walls of the first space S1, and the heat dissipation member 19 can also be said to be the member that constitutes the bottom wall of the first space S1. At least a portion of the main body portion 421 of the conductive member 42 of the substrate unit 40 is bonded to the heat dissipation member 19. Accordingly, at least some of the heat generated by the substrate unit 40 is emitted to the outside via the heat dissipation member 19. Note that it is sufficient that the main body portion 421 of the conductive member 42 and the heat dissipation member 19 are bonded via an insulating material that has high heat conductivity.

The frame member 11 is provided with base portions 12 and male thread portions 13 that project upward from the base portions 12 (see FIG. 2 and the like). Through-holes through which the male thread portions 13 can pass are formed in the leading end portions 422b of the extension portions 422 of the conductive member 42. By inserting the male thread portions 13 into the through-holes formed in the leading end portions 422b, passing the male thread portions 13 through through-holes formed in terminals 51 of the connection members 50, and screwing nuts or the like onto the male thread portions 13, the leading end portions 422b and the terminals 51 are pressed against the base portions 12 and brought into close contact with each other. Accordingly, the conductive member 42 and the connection members 50 are put into an electrically connected state (see FIG. 5 and the like).

The opening of the first space S1 formed in the first case body 10 is covered by the third case body 30. In other words, it can also be said that the third case body 30 constitutes the upper wall of the first space S1. The third case body 30 is fixed to the frame member 11 of the first case body 10. The third case body 30 is shaped so as to cover at least a portion of the upper surface of the frame member 11, excluding the base portions 12. The outer walls of the third case body 30 are shaped so as to have cutouts in portions, and these cut-out portions (cutout portions 31) ensure gaps for the passage of the extension portions 422 even when the third case body 30 is fixed to the first case body 10 (see FIG. 2 and the like). Any structure for fixing the first case body 10 and the third case body 30 may be provided, and therefore will not be described here.

When the third case body 30 is fixed to the first case body 10, the aforementioned gaps are formed between the cutout portions of the third case body 30 and the first case body 10, and the extension portions 422 pass through these gaps. Accordingly, the leading end portions 422b of the extension portions 422 are located above the base portions 12. Note that the third case body 30 of the present embodiment is provided with a connector portion 32 for electrically connecting the substrate 41 to an external device.

The second case body 20 is fixed to the first case body 10 so as to cover the base portions 12. Along with the leading end portions 422b of the extension portions 422, at least a portion of each of the connection members 50 (terminals 51) is located above the base portion 12, and therefore both the leading end portions 422b and these portions are covered by the second case body 20. From another viewpoint, the leading end portions 422b of the extension portions 422 and at least a portion of each of the connection members 50 are housed in the second spaces S2 constituted by the second case body 20 and the first case body 10 (frame member 11).

Figure 5:
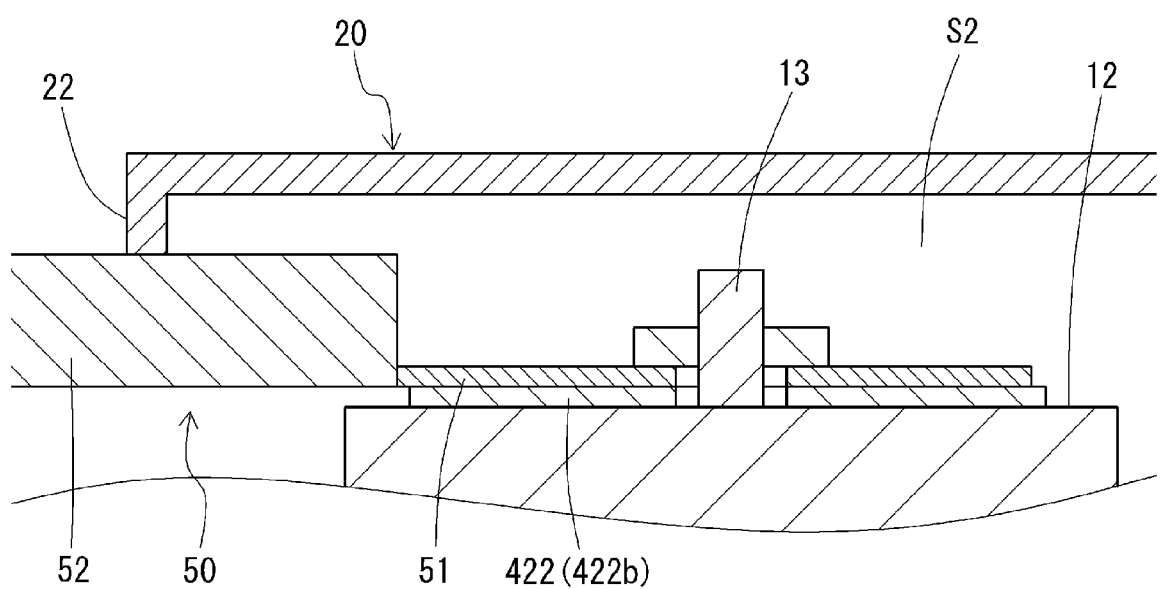
FIG. 5 is a diagram schematically showing a cross-section taken along line C-C in FIG. 1.

The second spaces S2 are partially open spaces, and the connection members 50 (electrical wires 52) pass through these openings (see FIGS. 1, 5, and the like). The openings of the second spaces S2 can also be said to be gaps formed between the first case body 10 and the second case body 20. In the present embodiment, projection portions 22 are formed on the second case body 20. The projection portions 22 project in the direction of reducing the size of the openings of the second spaces S2 (downward in the present embodiment). It is sufficient that the projection portions 22 come into contact with the connection members 50 (electrical wires 52) by fixing the second case body 20 to the first case body 10 in the state where the connection members 50 are connected to the male thread portions 13 (see FIG. 5 and the like). Providing these projection portions 22 on the second case body 20 suppresses the intrusion of water through the openings of the second spaces S2.

The second case body 20 is provided with lock piece portions 212 for being fixing to the first case body 10. Specifically, outer wall portions 21 of the second case body 20 are each provided with slits 211 that extend in the up-down direction from the leading end, and the portions between these slits 211 are the lock piece portions 212. Due to the provision of the slits 211, the lock piece portions 212 are shaped as cantilever portions that are capable of deforming. Four of these lock piece portions 212 are provided in the second case body 20, and the first case body 10 and the second case body 20 are integrated (see FIGS. 1, 6, and the like) due to the lock piece portions 212 being locked to lock protrusions 141 provided on the first case body 10 (frame member 11). Specifically, when the second case body 20 is pressed against the first case body 10 from above, the lock piece portions 212 undergo elastic deformation, and the lock protrusions 141 are fitted into through-holes formed in the lock piece portions 212.

In this way, the substrate unit 40 (excluding portions of the extension portions 422) are housed in the first space S1, and portions of the extension portions 422 (leading end portions 422b) and portions of the connection members 50 (terminals 51) are housed in the second spaces S2. The case 1 according to the present embodiment is provided with a structure for draining water produced by condensation or the like in the first space S1 in which the substrate unit 40 is housed, or water that entered from the outside. This drainage structure has the following configuration. Note that the drainage structure described below is provided in a forward region on the right side in the width direction of the case 1, but this drainage structure may be provided in a forward region on the left side in the width direction, in a rearward region on the right side in the width direction, or in a rearward region on the left side in the width direction.

Figure 6:
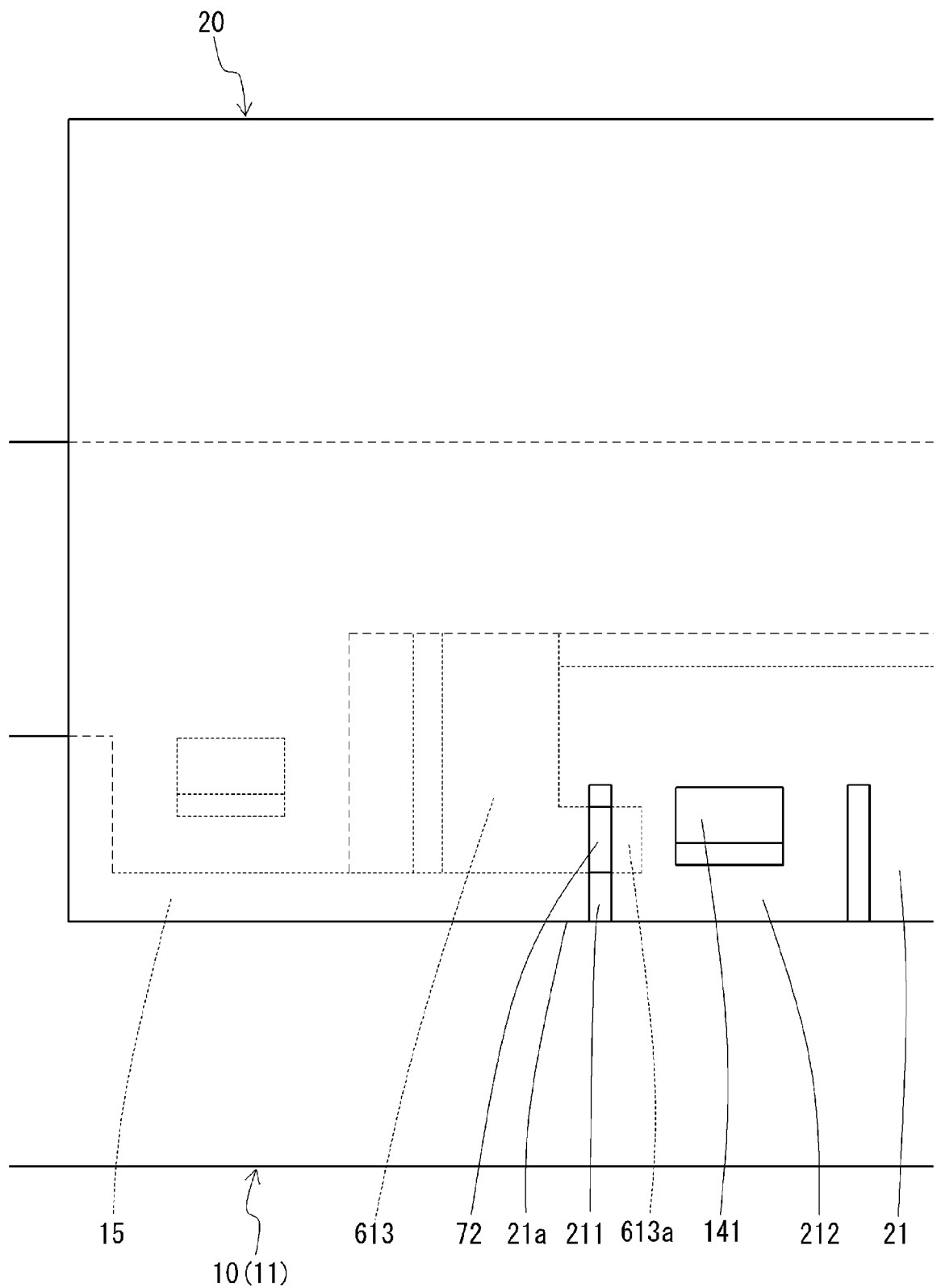
FIG. 6 is a side view of a case body according to the embodiment of the present invention, as viewed from the side on which a slit is formed.
Figure 7:
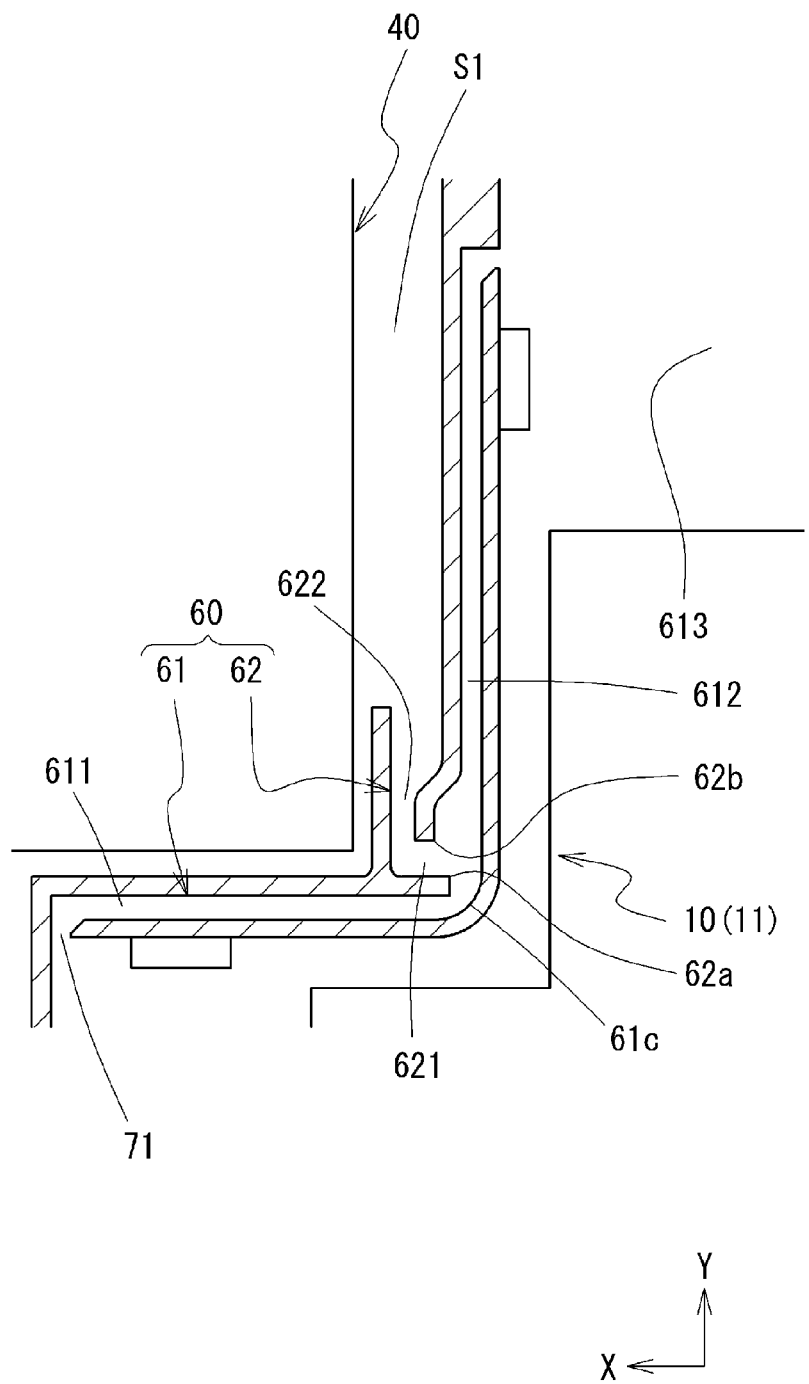
FIG. 7 is a diagram for describing a channel formed in a first case body (schematic view of a cross-section of the first case body taken along a plane that extends along the surface direction).
Figure 8:
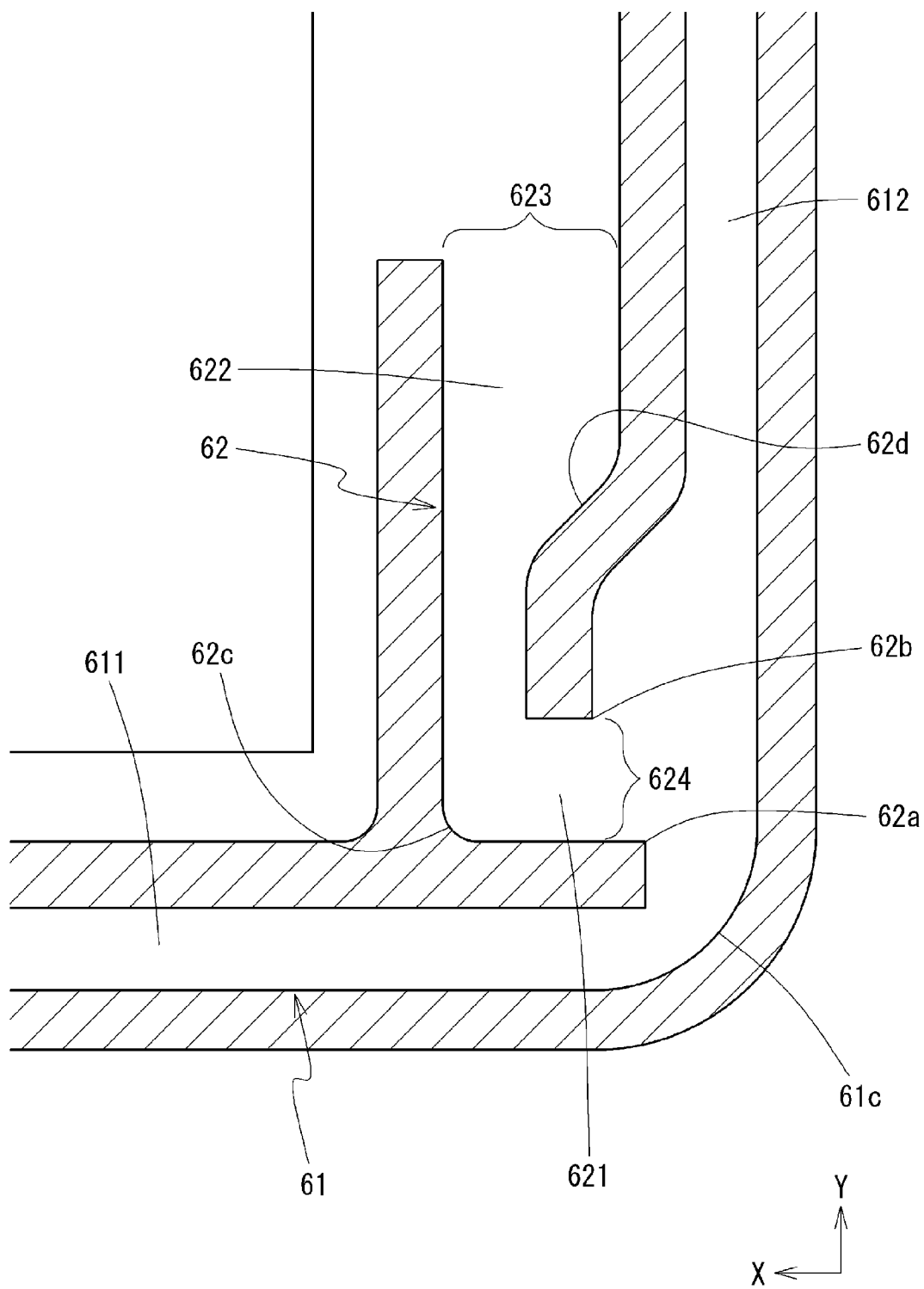
FIG. 8 is a diagram showing an enlarged view of a portion where a first channel portion and a second channel portion are connected.

The following describes the drainage structure with reference to FIGS. 6 to 8 and the like. A channel 610 that extends from the first space S1 is formed in the first case body 10. The channel 60 includes a first channel portion 61 and a second channel portion 62. The first channel portion 61 is a channel with two ends that are connected to outlets, namely a first outlet 71 and a second outlet 72 (i.e., is a channel that is open to the outside). The second channel portion 62 is a channel with one end connected to the first space S1, and the other end connected to a midway portion (between the first outlet 71 and the second outlet 72) of the first channel portion 61.

The first outlet 71 of the first channel portion 61 is provided in a central region in the width direction of the first case body 10 (frame member 11). The height of the first outlet 71 is the same as the height of the one end of the first channel portion 61. More specifically, the first outlet 71 is located at the same height as the boundary portion between the first case body 10 and the second case body 20 (see FIGS. 1, 2, and the like). The first channel portion 61 extends outward (rightward) in the width direction from the first outlet 71, and then bends at a midway point so as to extend rearward. In other words, the first channel portion 61 has a first portion 611 that extends in the width direction and a second portion 612 that extends in the front-back direction (see FIG. 7 and the like). The portion connected to the second channel portion 62 is located in the vicinity of the boundary portion between the first portion 611 and the second portion 612, that is to say in the vicinity of the bent portion of the first channel portion 61. In other words, the boundary portion with the second channel portion 62 is located on the first portion 611 side in the second portion 612 of the first channel portion 61. It can be said that the first channel portion 61 includes a portion that is bent toward the second channel portion 62 (first bent portion 61c) between the first outlet 71 and the portion connected to the second channel portion 62.

The second outlet 72 of the first channel portion 61 is provided in a central region in the front-back direction of the first case body 10 (frame member 11). The second portion 612 is connected to a space portion 613 formed in the first case body 10 (frame member 11). The space portion 613 is connected to the second outlet 72 (see FIGS. 6 to 8 and the like). In other words, the first channel portion 61 of the present embodiment is constituted by the first portion 611, second portion 612, and the space portion 613. Specifically, the channel 60 may include a portion that is not long and narrow as a groove, as long as it is a region through which water can flow (may include a sizable region such as the space 613). The first portion 611 and the second portion 612 are grooves that are open upward, and the third case body 30 is provided so as to cover these openings. The space portion 613 is a portion that is covered by the second case body 20.

As described above, the space portion 613 is connected to the second outlet 72. In the present embodiment, a hole (space) that serves as the second outlet 72 is formed in the second case body 20. Specifically, a portion of a slit 211 formed in the second case body 20 functions as the second outlet 72. In other words, a slit 211 that is formed for enabling deformation (cantilevering) of the lock piece portion 212 is used as the second outlet 72 for drainage (see FIG. 6 and the like). In this way, the second case body 20 is provided with a portion that serves as the second outlet 72.

A step is formed in at least a portion of the outer edge of the frame member 11 that constitutes a portion of the first case body 10. Specifically, step portions 15 that recede so as to be lower than the bottom faces of the first channel portions 61 (the bottom faces of the first portions 611, the second portions 612, and the space portions 613) are formed. Also, support protrusions 14, which are protrusions that project upward, are formed on the frame member 11 that constitutes a portion of the first case body 10. The upper surfaces of the support protrusions 14 serve as the base portions 12. The lock protrusions 141 that project outward are formed on the outer faces of the support protrusions 14. The outer faces of the support protrusions 14 are planar (flush) with the surfaces of the step portions 15 that extend in the up-down direction. In a view from the side, grooves (transverse grooves 613a) are formed in the frame member 11 by removing portions of the base portions of the support protrusions 14. These transverse grooves 613a are portions of the space portions 613 (see FIGS. 2, 6, and the like).

When the inward surfaces of the outer wall portions 21 of the second case body 20 are pressed against the frame member 11 so as to oppose the outer faces of the support protrusions 14 and then the surfaces of the step portions 15 that extend in the up-down direction, the lock piece portions 212 formed on the outer wall portions 21 come into contact with the lock protrusions 141 and undergo elastic deformation. When the second case body 20 is then further pressed against the frame member 11, the lock piece portions 212 return to their original shape, and the lock protrusions 141 are fitted into the through-holes formed in the lock piece portions 212. Accordingly, the second case body 20 is fixed to the first case body 10 (frame member 11). In the state where the second case body 20 is fixed to the first case body 10, portions of the leading end sides of the outer wall portions 21 of the second case body 20 enter the step portions 15. In other words, the inward surfaces of portions of the leading end sides of the outer wall portions 21 of the second case body 20 are in close contact with the surfaces of the step portions 15 that extend in the up-down direction, and at least a portion of the leading ends (leading end edges 21a) of the outer wall portions 21 of the second case body 20 are located at a position lower than the portions where the space portions 613 (transverse grooves 613a) of the first channel portions 61 provided in the frame member 11 are continuous with the slits 211, that is to say a position lower than the second outlets 72.

More specifically, the leading end edges 21a of the portions where the slits 211 (lock piece portions 212) are formed in the outer wall portions 21 of the second case body 20 are located at a position lower than the second outlets 72. From another viewpoint, boundary portions between the first case body 10 and the second case body 20 (the boundary lines extending in the front-back direction) at the surfaces of the case 1 on the outward sides in the width direction are located at positions lower than the second outlets 72. The slits 211 are formed so as to extend in the up-down direction from the leading ends of the outer wall portions 21 of the second case body 20, thus obtaining a structure in which portions of the upper sides of the slits 211 are overlapped with the space portions 613 (transverse grooves 613a) of the first channel portions 61 (see FIG. 6 and the like).

The first outlets 71 of the first channel portions 61 are formed at the same height as the boundary portions between the first case body 10 and the third case body 30 (see FIGS. 1, 2, and the like). On the other hand, the second outlets 72 of the first channel portion 61 are located at positions higher than the boundary portions between the first case body 10 and the second case body 20 (see FIG. 6 and the like). More specifically, there is a risk that water that attempts to intrude through boundary portions between the first case body 10 and the third case body 30 (gaps between these case bodies) will intrude through the first outlets 71, but water that attempts to intrude through boundary portions between the first case body 10 and the second case body 20 (gaps between these case bodies) is blocked by the step portions 15. In other words, the risk of water intruding through the second outlets 72 is significantly lower than the risk of water intruding through the first outlets 71.

The second channel portions 62 are channels that connect the first space S1 to the first channel portions 61. Out of the opening edges of each of the second channel portions 62 that face the first channel portions 61, a second-side opening edge 62b, which is the edge on the second outlet 72 side of the first channel portion 61, is located nearer to the first space S1 than a first-side opening edge 62a, which is the edge on the first outlet 71 side of the first channel portion 61, is. It can also be said that the first-side opening edge 62a projects farther on the first channel portion 61 side than the second-side opening edge 62b does.

The following are effects realized by the above-described configuration. Water flowing in a first channel portion 61 from the first outlet 71 side toward the second outlet 72 side passes through a midway portion that is connected to the second channel portion 62. The first-side opening edge 62a of the second channel portion 62 projects farther on the first channel portion 61 side than the second-side opening edge 62b does, and therefore at this time, the majority of the water flowing through the first channel portion 61 passes the portion connected to the second channel portion 62 without flowing in the second channel portion 62, and flows toward the second outlet 72. In other words, in this structure, water that enters through the first outlet 71 is not likely to flow into the first space S1 through the second channel portion 62.

In particular, the first channel portions 61 of the present embodiment each include the first bent portion 61c on the second channel portion 62 side at a location between the first outlet 71 and the portion connected to the second channel portion 62. Accordingly, water flowing from the first outlet 71 side toward the second outlet 72 side passes through the first bent portion 61c, thus moving away from the second channel portion 62 (boundary between the first channel portion 61 and the second channel portion 62). From another viewpoint, water that enters from the first portion 611 of the first channel portion 61 into the second portion 612 through the first bent portion 61c flows less on the second channel portion 62 side of the second portion 612, and flows more on the opposite side. In other words, by providing this first bent portion 61c, it is possible to further improve the effect of preventing water from entering the second channel portion 62.

According to this structure, water flowing through the first channel portions 61 from the second outlet 72 side toward the first outlet 71 side is likely to enter the second channel portions 62. However, in the present embodiment, the second outlets 72 are located at a position higher than the boundary portions of the first case body 10 and the second case body 20 as described above, and therefore water is not likely to intrude through the second outlets 72. Also, the projection portions 22 that reduce the size of the openings of the second spaces S2 are provided in the second case body 20, thus making it less likely for water to intrude into the space portions 613 of the first channel portions 61. In other words, the intrusion of water from the second outlet 72 side of the first channel portion 61 is suppressed, and therefore little water flows in from this direction.

In this way, according to the structure of the connection portion between the first channel portion 61 and the second channel portion 62 of the present embodiment, a certain amount of water is predicted to intrude from the first outlet 71 side, and even if water intrudes from the first outlet 71 side, that water is directly drained from the second outlet 72. The intrusion of water from the second outlet 72 side can be prevented to a certain extent by the shape of the second outlet 72 and the provision of the projection portions 22, and therefore it is not a big problem if the structure of the connection portion between the first channel portion 61 and the second channel portion 62 does not take this intrusion of water into account.

On the other hand, water that has entered the first space S1 or water produced in the first space S1 by condensation or the like flows through the second channel portion 62 and then into the first channel portion 61, and can be drained from the first outlet 71 or the second outlet 72. There are cases where the flowing direction of water cannot be predicted, such as when the case 1 is installed at an angle, or when the case 1 is installed in a vibrating environment, and therefore providing outlets in various directions enables water to be drained smoothly. In the present embodiment, the second outlet 72 and the connection portion between the first channel portion 61 and the second channel portion 62 are given the above-described structures in order to prevent a disadvantage that arises due to providing various outlets for the above reason (the water drainage outlets are factors promoting the intrusion of water).

Also, the second channel portions 62 need to exhibit an effect of suppressing the intrusion of water into the first space S1, while also exhibiting an effect of smoothly draining water from inside the first space S1. Accordingly, the size of the channel-side openings 624 that face the first channel portions 61 in the second channel portions 62 is set smaller than the size of the space-side openings 623 that face the first space S1 (see FIG. 8 and the like). Accordingly, with this structure, water inside the first space S1 easily intrudes into the second channel portions 62, but water inside the first channel portions 61 does not easily intrude into the second channel portions 62.

Furthermore, the second channel portions 62 include a bend. Specifically, they each include the first portion 621 in which water intruding from the first channel portion 61 flows in a straight manner, and the second portion 622 that is bent from the first portion 621 and extends toward the first space S1. The boundary portion between the first portion 621 and the second portion 622 is bent (second bent portion 62c) (see FIGS. 7, 8, and the like). In the present embodiment, the first portion 621 extends in the width direction, and the second portion 622 extends in the front-back direction. In this way, according to this structure in which water intruding from the first channel portion 61 into the second channel portion 62 flows in a straight manner and does not reach the first space S1, the intrusion of water into the first space S1 through the second channel portion 62 is even further suppressed.

Also, portions (tapered portions 62d) that decrease in width from the first space S1 side toward the first channel portion 61 side are formed in the second channel portions 62 (second portions 622) (see FIG. 8 and the like). Providing these tapered portions 62d suppress the intrusion of water from the first channel portion 61 side, while also allowing water to be smoothly drained from the first space S1.

Although an embodiment of the present invention is described in detail above, the present invention is not limited in any way to the foregoing embodiment, and various improvements can be made without departing from the gist of the present invention.

For example, although it is described that the case 1 according to the above embodiment is constituted by three case bodies, namely the first case body 10, the second case body 20, and the third case body 30, the number of case bodies, the specific shapes thereof, and the like can be changed as appropriate. Although it is described that the channel 60 is formed in the first case body 10 (frame member 11), it may be formed in any case body as long as it connects the first space S1 that house a housed object to the outside (an outlet).

Also, although it is described that the case 1 according to the above embodiment is for housing the substrate unit 40, any object may be housed in the first space S1. Also, any object may be housed in the second spaces S2. A configuration is possible in which the second spaces S2 are not provided.

The invention claimed is:

1. A case in which a housed object is to be housed in a housing space, the case comprising:
 a first case body in which a channel that extends from a region serving as the housing space is formed,
 wherein the channel includes
  a first channel portion having one end side connected to a first outlet and another end side connected to a second outlet, and
  a second channel portion that connects the first channel portion and the housing space, the second channel portion having a channel-side opening that is open to the first channel portion and
 the channel-side opening having a second-side opening edge spaced apart from a first-side opening edge, wherein the second-side opening edge is an edge on a second outlet side of the first channel portion and is located nearer to the housing space than the first-side opening edge, and the first-side opening edge is an edge on a first outlet side of the first channel portion.

2. The case according to claim 1, comprising a second case body that is integrated with the first case body, wherein a portion of the second outlet is formed in the second case body,
 wherein a boundary between an outer wall surface of the first case body and an outer wall surface of the second case body is located at a lower position than the second outlet.

3. The case according to claim 1, wherein the first channel portion includes a portion that is bent toward the second channel portion between the first outlet and a portion connected to the second channel portion.

4. The case according to claim 1, wherein the size of an opening of the second channel portion that faces the first channel portion is smaller than the size of an opening of the second channel portion that faces the housing space.

5. The case according to claim 4, wherein the second channel portion is bent.

6. The case according to claim 2, wherein the first channel portion includes a portion that is bent toward the second channel portion between the first outlet and a portion connected to the second channel portion.

7. The case according to claim 2, wherein the size of an opening of the second channel portion that faces the first channel portion is smaller than the size of an opening of the second channel portion that faces the housing space.

8. The case according to claim 3, wherein the size of an opening of the second channel portion that faces the first channel portion is smaller than the size of an opening of the second channel portion that faces the housing space.

* * * * *